United States Patent
David

(10) Patent No.: US 9,800,153 B2
(45) Date of Patent: Oct. 24, 2017

(54) NEGATIVE VOLTAGE GENERATOR

(71) Applicant: NXP B.V., Eindhoven (NL)

(72) Inventor: Stephane David, Sainte-croix Grand Tonne (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/800,889

(22) Filed: Jul. 16, 2015

(65) Prior Publication Data

US 2016/0036329 A1 Feb. 4, 2016

(30) Foreign Application Priority Data

Jul. 31, 2014 (EP) .................................... 14290223

(51) Int. Cl.
*H02M 3/158* (2006.01)
*H02M 3/07* (2006.01)
*H02M 1/08* (2006.01)
*H03K 17/06* (2006.01)

(52) U.S. Cl.
CPC ............. *H02M 3/158* (2013.01); *H02M 3/07* (2013.01); *H02M 1/08* (2013.01); *H02M 2003/071* (2013.01); *H03K 2017/066* (2013.01); *H03K 2217/0081* (2013.01)

(58) Field of Classification Search
None
See application file for complete search history.

(56) References Cited

U.S. PATENT DOCUMENTS

| 4,733,108 | A | | 3/1988 | Truong | |
|---|---|---|---|---|---|
| 5,179,296 | A | | 1/1993 | Ito | |
| 5,699,018 | A | * | 12/1997 | Yamamoto | H02M 1/14 327/536 |
| 2002/0171470 | A1 | * | 11/2002 | Sim | G11C 5/147 327/536 |
| 2003/0197546 | A1 | * | 10/2003 | Sim | G11C 5/147 327/534 |
| 2011/0018169 | A1 | | 1/2011 | Misawa et al. | |

(Continued)

FOREIGN PATENT DOCUMENTS

| DE | 196 22 972 A1 | 6/1997 |
|---|---|---|
| EP | 0 632 456 A2 | 6/1994 |
| JP | 2002 151968 A | 5/2002 |

OTHER PUBLICATIONS

Zhao, Jun et al; "A Charge Pump that Generates Negative High Voltage with Variable Voltage Gain"; Microelectronics Journal—Elsvier; 8 pages (Nov. 8, 2012).

(Continued)

*Primary Examiner* — Nguyen Tran
*Assistant Examiner* — Monica Mata

(57) ABSTRACT

In an embodiment there is: negative voltage generator configured to generate an output having a negative voltage from an input having a positive voltage comprising an input node configured to receive an alternating signal, an output node for outputting an output voltage of the generator and a ground node, a switching element configured to provide a conductive and non-conductive flow path between a first terminal and a second terminal in response to a control signal; a control element adapted to control the flow of current therethrough between a first terminal and a second terminal.

20 Claims, 2 Drawing Sheets

(56) References Cited

U.S. PATENT DOCUMENTS

2011/0018619 A1    1/2011  Cassia

OTHER PUBLICATIONS

Mohammad, M. Gh., et al; "Switched positive/negative charge pump design using standard CMOS transistors"; IET Circuits, Devices & Systems; 10 pages (Apr. 22, 2009).
"Charge Pump Circuit"; IBM Technical Disclosure Bulletin, vol. 33, No. 4; 2 pages (Sep. 1990).
Extended European Search Report for application 14290223.8 (Jan. 28, 2015).

* cited by examiner

NEGATIVE VOLTAGE GENERATOR

CROSS-REFERENCE TO RELATED APPLICATIONS

This application claims the priority under 35 U.S.C. §119 of European patent application no. 14290223.8, filed on Jul. 31, 2014, the contents of which are incorporated by reference herein.

This invention relates to a negative voltage generator. The invention also relates to an electronic device including said negative voltage generator configured to supply a negative voltage for said electronic device.

The generation of negative voltages from a positive or non-negative input voltage is problematic.

According to a first aspect of the invention, we provide a negative voltage generator configured to generate an output having a negative voltage from an input having a positive voltage comprising;
  an input node configured to receive an alternating signal comprising a signal that alternates between low and high non-negative voltage levels, an output node for outputting an output voltage of the generator and a ground node,
  a switching element configured to provide a conductive and non-conductive flow path between a first terminal and a second terminal in response to a control signal;
  a control element adapted to control the flow of current therethrough between a first terminal and a second terminal,
  the first terminal of the switching element connected to one of the output node and the ground node and the first terminal of the control element connected to the other of the output node and the ground node,
  a first control assembly comprising a first control capacitor and a first diode arranged in series between the input node and the ground node, the first control capacitor and first diode having a control node therebetween connected to a control terminal of the switching element for providing the control signal;
  a primary capacitor having a first plate connected to the input node and a second plate connected to an intermediate node, the intermediate node connected to the second terminal of the switching element and the second terminal of the control element;
  wherein one of the switching element and the control element is configured to be conductive over the high level part of the input signal and the other of the switching element and the control element is configured to be conductive over the low level part of the input signal.

This is advantageous as only a single alternating input signal is required to generate the negative voltage at the output. Further, the use of a switching element to control the periodic application of the output voltage to the output node from the primary capacitor is advantageous in terms of efficiency. Thus, the primary capacitor is charged through one of the switching element and the control element and discharged through the other. By actively switching the switching element by way of the first control assembly over the period of the alternating input signal an efficient negative voltage generator can be provided with a low voltage drop. The controlled conductivity of the switching element and control element, such that only one is substantially conductive at any one time over the alternating input signal provides for an efficient negative voltage generator.

Optionally, the switching element comprises a transistor having a gate terminal, source terminal and a drain terminal and the control terminal comprises the gate terminal. The use of a transistor as the switching element is advantageous as they typically have a low voltage drop.

Optionally, the control element comprises a second switching element configured to provide a conductive and non-conductive flow path between a first terminal and a second terminal in response to a second control signal and the generator includes a second control assembly comprising a second capacitor and a second diode arranged in series between the input node and the ground node, the second capacitor and second diode having a control node therebetween connected to a control terminal of the second switching element for providing the second control signal.

Accordingly, a negative voltage generator is described having a first control assembly and a second control assembly in which one of the control assemblies is configured to receive an inverted version of the input signal, the first control assembly configured to provide a control signal for a corresponding first switching element and the second control assembly configured to provide a control signal for a corresponding second switching element, the switching elements both connected to, at one of their switched terminals, the primary capacitor which is configured to be charged by the input signal, and wherein the other terminal of the first switching element is configured to provide an output voltage to the output node of the generator and the other terminal of the second switching element is connected to ground. The control assemblies may each comprise a capacitor and a diode in series and wherein a control node between said capacitor and diode provides the control signal.

Optionally, the second switching element comprises a transistor having a gate terminal, a source terminal and a drain terminal, and the control terminal comprises the gate terminal.

Optionally, the output node is connected to an output capacitor and the output of the negative voltage generator is applied across said output capacitor.

Optionally, the first diode is arranged in parallel with a first resistor. Optionally, the second diode is arranged in parallel with a second resistor.

Optionally, a third resistor is arranged, in series, between the intermediate node and the control element.

Optionally, the control element comprises a third diode having an anode and a cathode, the anode connected to the intermediate node and the cathode connected to the ground node.

Optionally, the first control assembly receives the input signal through a logic inverter. Optionally, the logic inverter comprises a NOT gate. Optionally, one or both of the transistors comprise enhancement mode MOSFETs.

Optionally, the generator is configured to receive a single, substantially square wave, alternating input signal.

Optionally, the negative voltage generator includes an alternating signal generator for supplying an alternating input signal to the input node.

According to a second aspect of the invention we provide a circuit comprising the negative voltage generator as defined in the first aspect configured such that the output provides a gate bias signal for a depletion mode pHEMT or MESFET.

According to a third aspect of the invention we provide an electronic device including the negative voltage generator as defined in any one of claims 1 to 13.

There now follows, by way of example only, a detailed description of the invention with reference to the accompanying drawings, in which.

Figure 1:
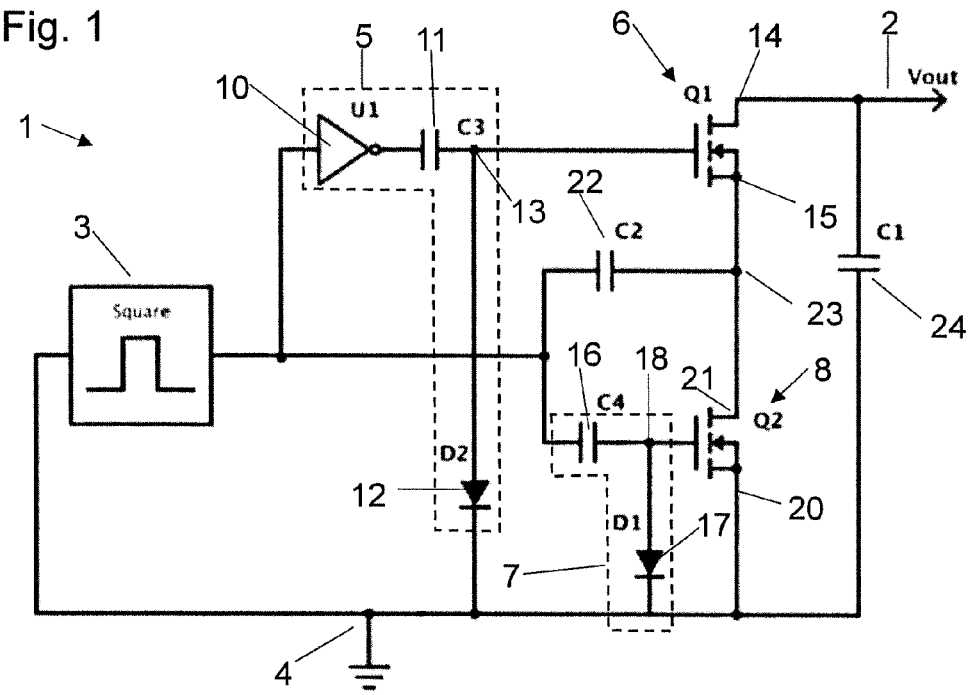
FIG. 1 shows a first example negative voltage generator.

FIG. 1 shows a negative voltage generator 1 configured to generate, at an output node 2, a negative voltage. The generator 1 is configured to receive, at an input node 3, a positive input voltage. In particular, the generator 1 is configured to receive at the input node 3 an alternating signal which alternates between low and high non-negative voltages. Thus, the input signal may alternate between 0 and +Vsupply Volts. The generator 1 also includes a ground node 4.

The generator 1 includes a first control assembly 5 which is configured to control a first switching element 6. The generator 1 also includes a second control assembly 7 which is configured to control a control element comprising a second switching element 8. Thus, the first and second control assemblies 5, 7 are configured to generate control signals for switching their respective switching elements 6, 8 between open (non-conductive) and closed (conductive) configurations.

The first control assembly 5 comprises a logic inverter 10, a first control capacitor 11 and a first diode 12 arranged in series between the input node 3 and the ground node 4. The first control capacitor 11 and first diode 12 have a control node 13 therebetween. Thus, the control capacitor 11 comprises a first plate connected to the output of the logic inverter 10 (which may comprise a NOT gate) and a second plate connect to the control node 13. The first diode 12 comprises an anode connected to the control node 13 and a cathode connected to the ground node 4. The logic inverter is configured to receive the alternating input signal at its input.

The control node 13 is connected to a control terminal of the first switching element 6. The first control assembly thus provides a control signal for opening and closing a flow path through the first switching element 6 between a first terminal 14 and a second terminal 15.

The second control assembly 7 comprises a second control capacitor 16 and a second diode 17 arranged in series between the input node 3 and the ground node 4. The second control capacitor 16 and second diode 17 have a second control node 18 therebetween. Thus, the second control capacitor 11 comprises a first plate connected to the input node 3 and a second plate connect to the second control node 18. The second diode 17 comprises an anode connected to the second control node 18 and a cathode connected to the ground node 4. The second control assembly 7 receives a non-inverted input signal.

The second control node 18 is connected to a control terminal of the second switching element 8. The second control assembly 7 thus provides a control signal for opening and closing a flow path through the second switching element 8 between a first terminal 20 and a second terminal 21.

The first and second switching elements 6, 8 each comprise a transistor having a gate terminal, a source terminal and a drain terminal. The gate terminal of each transistor forms the aforementioned control terminal. The drain terminal of each transistor comprises the aforementioned first terminal 14, 20 and the source terminal of each transistor comprises the aforementioned second terminal 15, 21. The transistors 6, 8 may each comprise an enhancement mode MOSFET.

The generator 1 further comprises a primary capacitor 22 having a first plate connected to the input node 3 and a second plate connected to an intermediate node 23. The intermediate node 23 is connected to the second terminal 15 of the first switching element 15 and the second terminal 21 of the second switching element 8. Thus, the primary capacitor 22 is connected to a point between the two switching elements 6, 8.

The first terminal 14 of the first switching element 6 is connected to the output node 2 of the negative voltage generator 1. The second terminal of the second switching element is connected to the ground node 4. The voltage generated by the generator 1 is applied across an output capacitor 24. Thus, the output capacitor 24 is connected between the output node 2 and the ground node 4.

In operation, the first and second control assemblies 5 and 7 are provided with the same alternating input signal. Due to the presence of the logic inverter 10, the first control assembly 5 will provide a control signal which is substantially the inverse of the control signal generated by the second control assembly 7. Accordingly, the switching element 6 will be open when the switching element 8 is closed and vice-versa.

The primary capacitor 22 also receives the same alternating input signal at its first plate. The second plate of the primary capacitor is connected to the intermediate node 23 between the first and second switching elements 6, 8. Thus, given the switching of the switching elements 6, 8 described above, the second plate of the capacitor will alternate between being connected to the ground node through second switching element 8 and connected to the output node 2 through the first switching element 6 over substantially exclusive subsections of the period of the alternating input signal.

During a high level of the input signal, the second capacitor 16 is charged through the second diode 17, which will be forward biased. Accordingly, the gate terminal of the second switching element 8 is maintained positive by the voltage dropped through the second diode 17. The second switching element 8 will thus be conductive to provide a connection between its first and second terminals 20, 21. The primary capacitor 22 is charged from the input signal, Vsupply, through the second switching element 8.

The first switching element 6 is non-conductive during the high level of the input signal.

The voltage drop across the second capacitor 16 is Vsupply−$vd_{17}$, or Vsupply−vgs2. The voltage across the primary capacitor 22 is Vsupply−vds2. Vgs2 and vds2 relate to the gate-source and drain source voltage of the second switching element 8. $Vd_{17}$ comprises the voltage dropped across the second diode 17.

During the low level of the input signal, the potential difference at the primary capacitor 22 and the second capacitor 16 remains. However, their common node (i.e. their first plates) is now at a 0V potential (the low level in this example). This lowers the opposed side of each capacitor to; −Vsupply+$vd_{17}$ for the second capacitor 16 and −Vsupply+vds2 for the primary capacitor 22. This has the effect of reverse biasing the second diode 17 and applying a control signal to the second switching element 8 that disconnects the terminals 20, 21. Accordingly, no charge can escape the primary capacitor 22 through the second switching element 8.

The low level input signal applied at the logic inverter 10 causes the first capacitor 11 to be charged through the first diode 12, which will be forward biased. Accordingly, the gate terminal of the first switching element 8 is maintained positive by the voltage dropped through the first diode 12. The first switching element 6 will thus be conductive between its first and second terminals 14, 15.

As the first switching element 6 provides a connection between the primary capacitor 22 and the output node 2, the output capacitor 24 is charged from the potential of the primary capacitor 22 (−Vsupply+vds2). The first capacitor 11 holds Vsupply−$vd_{12}$, where $vd_{12}$ comprises the voltage dropped across the first diode 12 at the end of the high period.

During the next high level, the charge on the first capacitor 11 is inverted, thereby closing the first switching element and reversing the bias on the first diode 12, which acts to prevent current leaks from the primary capacitor 22 to the output capacitor 24.

Thus a negative voltage is generated at the output node 2 across the output capacitor 24 from the control of charging of the primary capacitor 22 and charge transfer from the primary capacitor 22 to the output capacitor 24 over a period of the alternating non-negative input signal. This is achieved by the two switching elements 6 and 8 that alternate the connection at the intermediate node 23 between the output node 2 and the ground node 4. In particular, the switching elements 6 and 8 provide for connection of second plate of the primary capacitor 22 to ground when its first plate receives a high level of the input signal and provides for connection of second plate to the output node 2 when its first plate receives a low level of the input signal.

It will be appreciated that the capacitance of the primary capacitor 22 can be used to adjust the output voltage.

Thus, in summary, the alternating input signal charges the first control capacitor 11 on a low clock cycle and second control capacitor 16 on a high clock cycle. This results in a negative potential on the low clock cycle at the gate of the second switching element 8 and a negative potential on the high clock cycle at the gate of the first switching element 6. Thus, the control capacitors 11 and 16 act as two "half" negative generators which provide a negative potential at the switching elements to prevent leakage from the primary capacitor 22.

Figure 2:
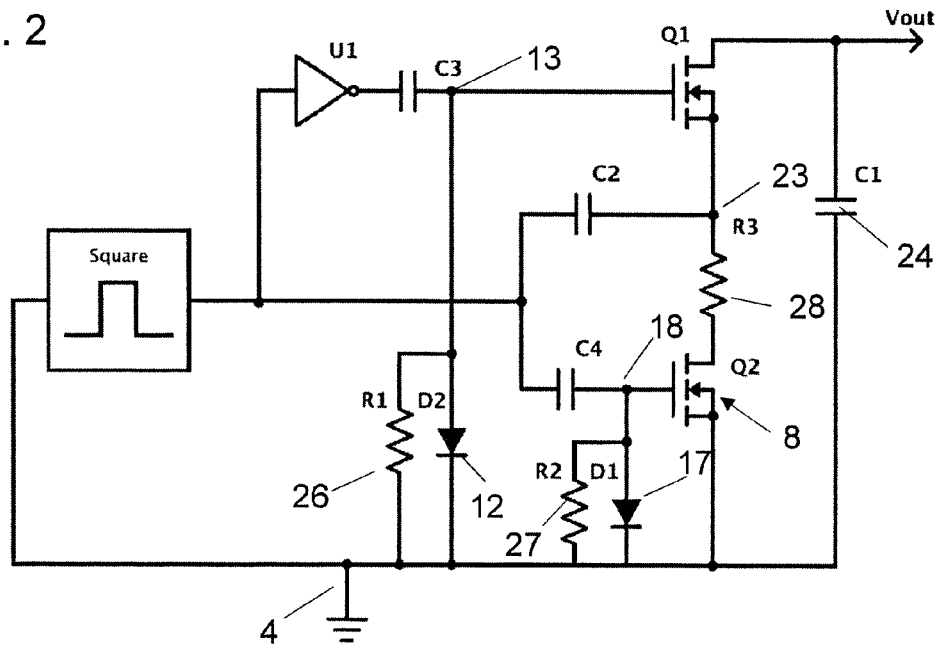
FIG. 2 shows a second example negative voltage generator.

FIG. 2 shows a second example negative voltage generator 1. This second embodiment is substantially identical to the generator shown in FIG. 1, except for the addition of three resistors. It will be appreciated that in other examples (not shown) any one or any two of the resistors described below could be provided.

Thus, a first resistor 26 is provided in parallel with the first diode 12 between the control node 13 and the ground node 4. A second resistor 27 is provided in parallel with the second diode 17 between the control node 18 and the ground node 4. Finally, a third resistor 28 is provided in series between the intermediate node 23 and the second switching element 8.

The first and second resistors 26, 27 are implemented to provide a leakage current to ground for safe operation of the circuit during any possible idle time. The first and second resistors 26, 27 also allow the circuit to adjust to a new supply voltage, if required. The first and second resistors may be between 0.5 and 2 MOhms. This has been found to be sufficiently high not to substantially interfere with normal operation but provides sufficient leakage current for the first and second capacitors 11 and 16 to discharge during an idle period.

The optional third resistor 28 introduces a time constant during the charge cycle of the primary capacitor 22. It has been found that this may reduce the ripple present at the output node 2 of this circuit due to the alternating nature of the input signal. In tests, the ripple has been found to be typically below 20 mV without implementing the third resistor 28 and below 10 mV with the third resistor 28 (with a supply voltage of +2.7 V).

Figure 3:
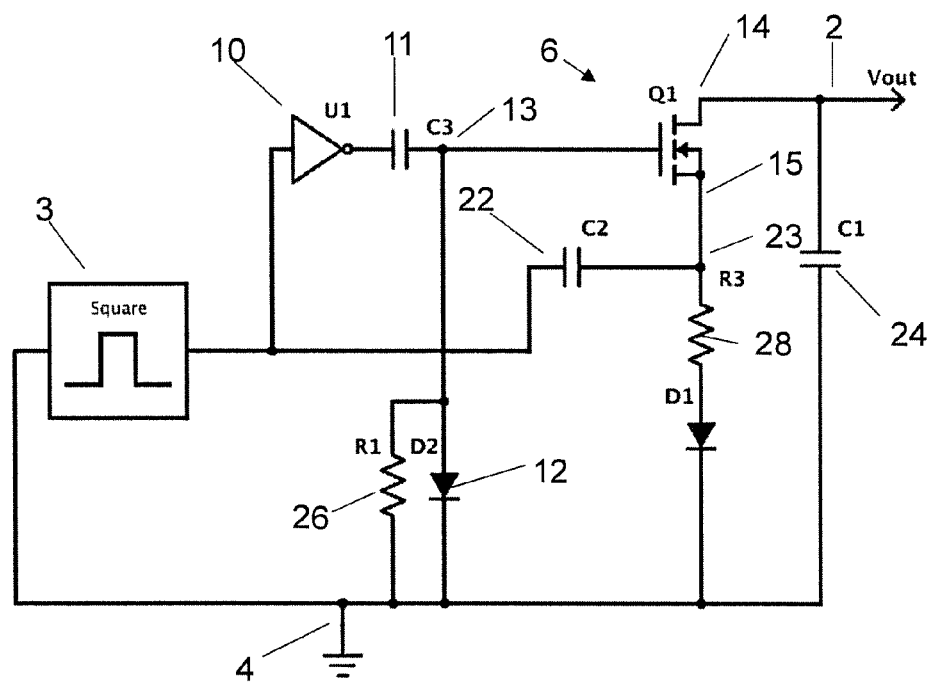
FIG. 3 shows a third example negative voltage generator.

FIG. 3 shows a third embodiment in which the control element comprises a diode rather than the switching element 8 provided in previous embodiments. The remainder of the negative voltage generator 1 is substantially identical to that described above in relation to FIG. 2, which includes the optional resistors 26 and 28, and the same reference numerals have been used.

Thus, in this embodiment, the function of the second control assembly 7 and switching element 8 is provided by the primary capacitor 22 being connected to the ground node 4 at the intermediate node 23 through a third diode 30. Thus, the anode of the third diode 30 is connected to the intermediate node 24 and the cathode of the third diode 30 is connected to the ground node 4.

The operation of this embodiment is similar to the previous embodiments except that, during a high level input signals the primary capacitor 22 is charged from the input signal, Vsupply, through the third diode 8. As described above, the first switching element is in its non-conductive state for a high level input signal. On the low level part of the input signal the first switching element is conductive and the third diode 30 will be reverse biased. Accordingly, the primary capacitor 22 provides for a negative voltage across the output capacitor 24.

Typical applications for such a negative voltage generator 1 include the generation of biasing voltages for depletion mode (D-mode) GaAs pHEMTs or MESFETs. These high performance transistors are required for their low noise figure and high frequency performance in applications such as satellite receivers, radars or power amplifiers. The gate voltage they require ranges from −1.5 to 0V, which can be provided by the generator 1.

Integration of such negative voltage generators is also advantageous for original equipment manufacturers wishing to reduce the component count in the design of Low Noise Blocks (LNBs) for satellite receivers.

The invention claimed is:

1. A negative voltage generator configured to generate an output having a negative voltage from an input having a positive voltage comprising;
   an input node configured to receive an alternating signal comprising a signal that alternates between low and high non-negative voltage levels, an output node for outputting an output voltage of the generator and a ground node,
   a switching element configured to provide a conductive and non-conductive flow path between a first terminal and a second terminal in response to a control signal;
   a control element adapted to control the flow of current therethrough between a first terminal and a second terminal,
   the first terminal of the switching element connected to one of the output node and the ground node and the first terminal of the control element connected to the other of the output node and the ground node,
   a first control assembly comprising a first control capacitor and a first diode arranged in series between the input node and the ground node, the first control capacitor having first and second terminals, the first terminal of the first control capacitor is coupled to the input node, the first diode having first and second terminals, the first terminal of the first diode is coupled to the second terminal of the first control capacitor and the second terminal of the first diode is coupled to the ground node, the first control capacitor and first diode having a control node therebetween directly connected to a control terminal of the switching element for providing the control signal;

a primary capacitor having a first plate connected to the input node and a second plate connected to an intermediate node, the intermediate node connected to the second terminal of the switching element and the second terminal of the control element;

wherein one of the switching element and the control element is configured to be conductive over the high level part of the input signal and the other of the switching element and the control element is configured to be conductive over the low level part of the input signal.

2. A negative voltage generator according to claim 1, in which the switching element comprises a transistor having a gate terminal, source terminal and a drain terminal and the control terminal comprises the gate terminal.

3. A negative voltage generator according to claim 1, in which the control element comprises a second switching element configured to provide a conductive and non-conductive flow path between a first terminal and a second terminal in response to a second control signal and the generator includes a second control assembly comprising a second capacitor and a second diode arranged in series between the input node and the ground node, the second capacitor and second diode having a control node therebetween connected to a control terminal of the second switching element for providing the second control signal.

4. A negative voltage generator according to claim 3, in which the second switching element comprises a transistor having a gate terminal, a source terminal and a drain terminal, and the control terminal comprises the gate terminal.

5. A negative voltage generator according to claim 1, in which the output node is connected to an output capacitor and the output of the negative voltage generator is applied across said output capacitor.

6. A negative voltage generator according to claim 1, in which the first diode is arranged in parallel with a first resistor.

7. A negative voltage generator according to claim 3, in which the second diode is arranged in parallel with a second resistor.

8. A negative voltage generator according to claim 1, in which a third resistor is arranged, in series, between the intermediate node and the control element.

9. A negative voltage generator according to claim 1, in which the control element comprises a third diode having an anode and a cathode, the anode connected to the intermediate node and the cathode connected to the ground node.

10. A negative voltage generator according to claim 1, in which the first control assembly receives the input signal through a logic inverter.

11. A negative voltage generator according to claim 2, in which the transistor comprises an enhancement mode MOSFET.

12. A negative voltage generator according to claim 1 in which the generator is configured to receive a single, square wave, alternating input signal.

13. A negative voltage generator according to claim 1 in which the negative voltage generator includes an alternating signal generator configured to supply an alternating input signal to the input node.

14. A circuit comprising the negative voltage generator as defined in claim 1 configured such that the output provides a gate bias signal for a depletion mode pHEMT or MESFET.

15. An electronic device including the negative voltage generator as defined claim 1.

16. A method for generating a negative voltage at an output of a negative voltage generator comprising an input having a positive voltage, the method comprising:

receiving, at an input node of the negative voltage generator, an alternating signal comprising a signal that alternates between low and high non-negative voltage levels;

providing, by a switching element of the negative voltage generator, a conductive and non-conductive flow path between a first terminal and a second terminal in response to a control signal, wherein the first terminal of the switching element is connected to one of an output node and a ground node of the negative voltage generator;

controlling, at a control element of the negative voltage generator, the flow of current therethrough between a first terminal and a second terminal, wherein the first terminal of the control element is connected to the other of the output node and the ground node as compared to the first terminal of the switching element;

providing, at a first control assembly, a control signal to the switching element, wherein the first control assembly comprises a first control capacitor and a first diode arranged in series between the input node and the ground node, the first control capacitor having first and second terminals, the first terminal of the first control capacitor is coupled to the input node, the first diode having first and second terminals, the first terminal of the first diode is coupled to the second terminal of the first control capacitor and the second terminal of the first diode is coupled to the ground node, the first control capacitor and first diode having a control node therebetween directly connected to a control terminal of the switching element for providing the control signal, wherein a primary capacitor of the negative voltage generator comprises a first plate connected to the input node and a second plate connected to an intermediate node, the intermediate node connected to the second terminal of the switching element and the second terminal of the control element;

causing one of the switching element and the control element is configured to be conductive over the high level part of the input signal and the other of the switching element and the control element to be conductive over the low level part of the input signal; and outputting, at an output node of the negative voltage generator, an output voltage.

17. The method of claim 16, wherein the switching element comprises a transistor having a gate terminal, source terminal and a drain terminal and the control terminal comprises the gate terminal.

18. The method of claim 16, further comprising:

providing, by a second control assembly of the negative voltage generator, a second control signal to a second switching element of the control element; and providing, by the second switching element, a conductive and non-conductive flow path between a first terminal and a second terminal in response to the second control signal, wherein the second control assembly comprises a second capacitor and a second diode arranged in series between the input node and the ground node, the second capacitor and second diode having a control node therebetween connected to a control terminal of the second switching element for providing the second control signal.

19. The method of claim 18, wherein the second switching element comprises a transistor having a gate terminal, a source terminal and a drain terminal, and the control terminal comprises the gate terminal.

20. The method of claim 16, further comprising:
applying the output of the negative voltage generator across an output capacitor, wherein the output node is connected to the output capacitor.

* * * * *